(12) United States Patent
Lee et al.

(10) Patent No.: US 7,307,482 B2
(45) Date of Patent: Dec. 11, 2007

(54) RING OSCILLATOR SETTING APPARATUS AND METHOD DEPENDING ON ENVIRONMENTAL CHANGES OF AN IMAGE FORMATION APPARATUS

(75) Inventors: Kwon-Cheol Lee, Seoul (KR); Sang-Sin Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 103 days.

(21) Appl. No.: 11/136,584

(22) Filed: May 25, 2005

(65) Prior Publication Data

US 2006/0017514 A1   Jan. 26, 2006

(30) Foreign Application Priority Data

Jul. 20, 2004   (KR) .................. 10-2004-0056422

(51) Int. Cl.
*H03K 3/03* (2006.01)
*H03B 5/12* (2006.01)
*H03L 1/00* (2006.01)

(52) U.S. Cl. .................. 331/57; 331/46; 331/49; 331/66; 331/176

(58) Field of Classification Search .......... 331/57, 331/176, 66, 46, 49, 55, 56, 48
See application file for complete search history.

(56) References Cited

U.S. PATENT DOCUMENTS 5,036,216 A * 7/1991 Hohmann et al. .......... 327/157
5,389,898 A * 2/1995 Taketoshi et al. .......... 331/2
5,465,063 A * 11/1995 Fukuda et al. .......... 327/512
5,604,468 A * 2/1997 Gillig .......... 331/176
5,629,649 A * 5/1997 Ujiie .......... 331/17
5,745,130 A   4/1998 Becerra et al.

FOREIGN PATENT DOCUMENTS

JP   61-105629   *   5/1986
JP   08-011344       1/1996
JP   11-055477       2/1999

(Continued)

*Primary Examiner*—Benny Lee
*Assistant Examiner*—Ryan J Johnson
(74) *Attorney, Agent, or Firm*—Roylance, Abrams, Berdo & Goodman, L.L.P.

(57) ABSTRACT

A ring oscillator setting apparatus and method depending on an environmental change of an image formation apparatus is provided. The apparatus includes a plurality of ring oscillators for generating different oscillation frequencies. The apparatus further includes a loopspeed detection unit to detect a loopspeed representing the number of pulses generated at the oscillation frequency by one of the ring oscillators selected from the plurality of ring oscillators for a predetermined unit time. Moreover, a state sensing unit is provided to detect a state of system environment of the image formation apparatus. A setting control unit is also provided to select and set one of the ring oscillators selected corresponding to change of the loopspeed detected from the loopspeed detection unit among the plurality of ring oscillators in response to the detected state of the state sensing unit. Therefore, even when external environment changes such as temperature and voltage of the image formation apparatus change, the one of the ring oscillators selected having the optimal loopspeed to generate a video clock can be set. Therefore, it is possible to minimize degradation of image quality caused by environmental changes.

10 Claims, 3 Drawing Sheets

FOREIGN PATENT DOCUMENTS

| | | |
|---|---|---|
| JP | 2001-088344 | 4/2001 |
| JP | 2001-326761 | 11/2001 |
| JP | 2003-015067 | 1/2003 |
| JP | 2003-195379 | 7/2003 |
| JP | 2003-266759 | 9/2003 |
| JP | 2003-305887 | 10/2003 |

* cited by examiner

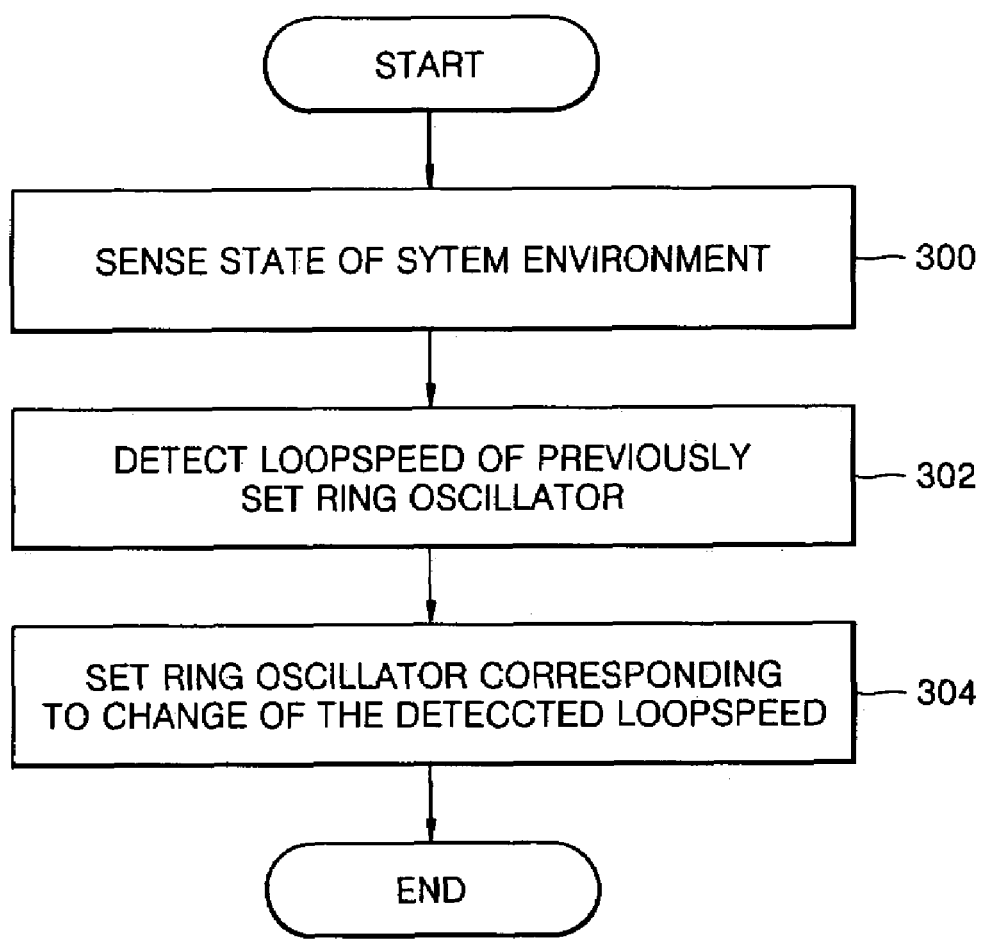

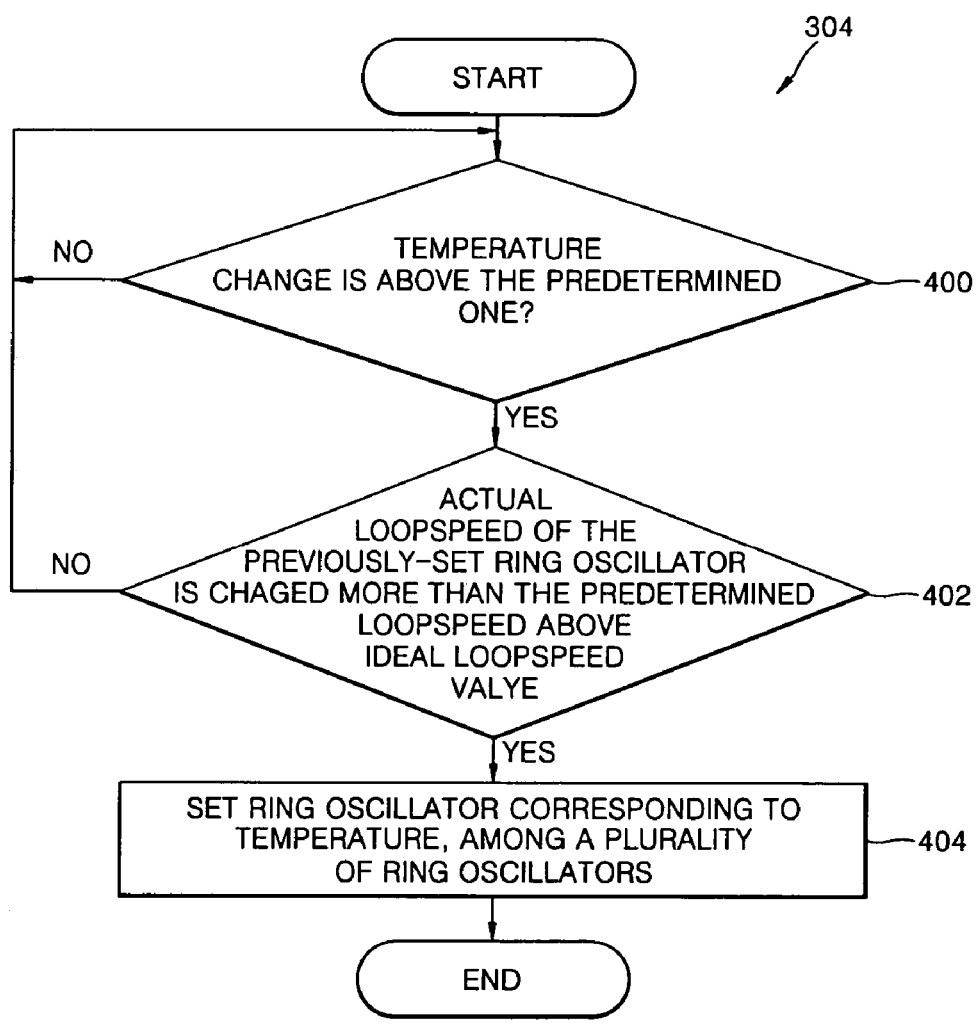

RING OSCILLATOR SETTING APPARATUS AND METHOD DEPENDING ON ENVIRONMENTAL CHANGES OF AN IMAGE FORMATION APPARATUS

CROSS-REFERENCE TO RELATED APPLICATIONS

This application claims the benefit under 35 U.S.C. 119(a) of Korean Patent Application No. 10-2004-0056422, filed on Jul. 20, 2004, the entire disclosure of which is hereby incorporated by reference.

BACKGROUND OF THE INVENTION

1. Field of the Invention

The present invention relates to an image formation apparatus such as a color laser beam printer and a multi-functional device having a plurality of laser scanning units. More specifically, the present invention relates to a ring oscillator setting apparatus and method depending on environmental changes of the image formation apparatus to set a ring oscillator having an optimal loopspeed to generate a video clock.

2. Description of Related Art

In conventional image formation apparatuses, a laser printer modulator includes a ring oscillator, a loopspeed detection unit having a modulator, a clock generator with a ring oscillator, a loopspeed detection unit, and a clock generation unit.

The ring oscillator generates a predetermined frequency. The ring oscillator includes an odd number of inverter chains. In general, an inverter block is constructed by connecting three or five inverters in series, and serves as one tab. The ring oscillator is sensitive to noise so that its oscillation frequency may vary depending on change of a design, temperature, and voltage. A loopspeed refers to the number of pulses generated at the oscillation frequency by the ring oscillator for a predetermined unit time.

A circuit for video clock generation and modulation uses the ring oscillator. The circuit for video clock generation is closely related to the ring oscillator and the loopspeed for changing and modulating frequency. The oscillation frequency of the ring oscillator may vary depending on changes in the external environment such as temperature and voltage. Consequently, changes in the external environment may lead to image quality degradation. Accordingly, in order to minimize change of the oscillation frequency of the ring oscillator, a method utilizing the step of driving static current in the power supply unit of the ring oscillator can be employed. However, with the above-identified method, it is relatively difficult to cope with changes in external temperature. Moreover, when a variety of video clocks are used, it is necessary to have a large internal operational circuit of a video clock generator and a modulator to deal with all of wideband frequency ranges. Therefore, problems with image quality degradation may arise including damage of video data. Damage of video data is caused by the modulator changing the loopspeed of the ring oscillator due to changes in the system environment such as temperature change.

Accordingly, there is a need for an image formation apparatus having an improved ring oscillator setting apparatus that has a relatively optimal loopspeed even when the external environment changes.

SUMMARY OF THE INVENTION

An aspect of the present invention is to solve at least the above problems and/or disadvantages and to provide at least the advantages described below. Accordingly, an aspect of the present invention is to provide a image formation apparatus having a ring oscillator setting apparatus which depends upon environmental change which enables a relatively optimal loopspeed even when external environment of the image formation apparatus changes.

Another aspect of the present invention also provides a ring oscillator setting method which depends on environmental changes of an image formation apparatus so that the ring oscillator can have a relatively optimal loopspeed even when external environment of the image formation apparatus is changed.

According to an aspect of the present invention, there is provided a ring oscillator setting apparatus depending on environmental changes of an image formation apparatus. The ring oscillator setting apparatus includes a plurality of ring oscillators to generate different oscillation frequencies, a loopspeed detection unit to detect a loopspeed which represents the number of pulses generated at the oscillation frequency by one of the ring oscillators selected from the plurality of ring oscillators for a predetermined unit time, and a state sensing unit to detect a state of system environment of the image formation apparatus. The ring oscillator setting apparatus further includes a setting control unit to select and set the one of the ring oscillators selected corresponding to change of the loopspeed detected from the loopspeed detection unit among the plurality of ring oscillators in response to the detected state by the state sensing unit.

According to another aspect of the present invention, there is provided a ring oscillator setting method depending on environmental changes. The method includes (a) detecting a state of system environment of an image formation apparatus; (b) detecting a loopspeed representing the number of pulses generated at an oscillation frequency by a previously-set ring oscillator for a predetermined unit time; and (c) selecting and setting the one of the ring oscillators selected corresponding to change of the detected loopspeed among a plurality of ring oscillators each generating a different oscillation frequency.

Other objects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other objects, features, and advantages of certain embodiments of the present invention will be more apparent from the following description taken in conjunction with the accompanying drawings, in which:

FIG. 3 is a flow chart for explaining a ring oscillator setting method depending on environmental change of an image formation apparatus in accordance with an embodiment of present invention; and FIG. 4 is a flow chart for explaining operation S304 shown in FIG. 3.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of the embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 1:
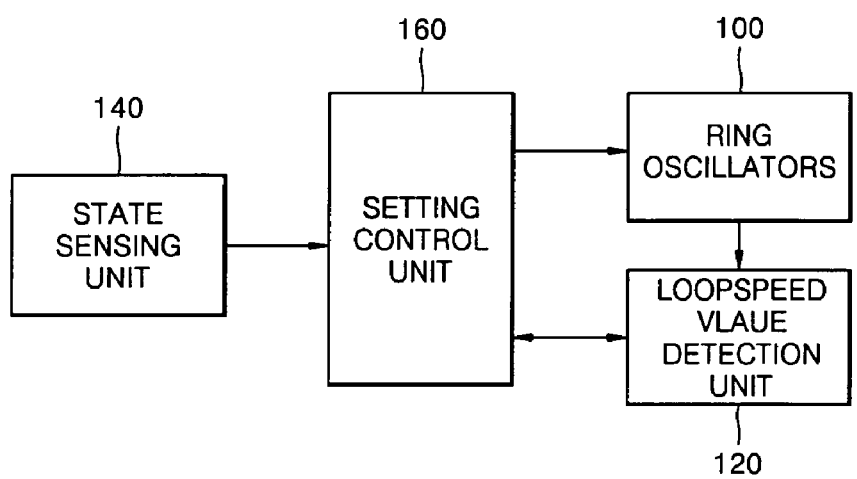
FIG. 1 is a block diagram for explaining a ring oscillator setting apparatus depending on environmental change of an image formation apparatus in accordance with an embodiment of the present invention.

FIG. 1 is a block diagram for explaining a ring oscillator setting apparatus depending on environmental change of an image formation apparatus. The ring oscillator setting apparatus includes a plurality of ring oscillators 100, a loopspeed detection unit 120, a state sensing unit 140 and a setting control unit 160.

Ring oscillators 100 generate different oscillation frequencies. Accordingly, generated video clocks are different from each other. In other words, each of the ring oscillators 100 includes a plurality of fast ring oscillators and slow ring oscillators. The loopspeed refers to the number of pulses generated at the oscillation frequency by each of the ring oscillators 100 for a predetermined unit time. Herein, the term "predetermined unit time" refers to a time period of a system clock generated by the image formation apparatus.

Each of the ring oscillators 100 includes an odd number of inverter chains. Preferably, one inverter may operate as one tap. However, in this case, a signal between taps may not be obtained due to the difference of transition time depending on logic states. In particular, when other devices in the modulator are driven with the respective tap signals, there occurs a violation of setup/hold time conditions of memory cells such as flip-flops. To meet the above conditions, preferably three or five inverters are connected in series to form one converter block, and in turn, the one converter block forms one tab. Each of the ring oscillators 100 is sensitive to noise. Therefore, oscillation frequency may vary depending on change of a design, temperature, and voltage.

The loopspeed value detection unit 120 detects a loopspeed of the oscillation frequency generated by the previously-set ring oscillator among the plurality of ring oscillators 100. The loopspeed value detection unit 120 outputs the detected loopspeed to the setting control unit 160 in accordance with a request signal.

A state sensing unit 140 detects a state of the system environment of the image formation apparatus. The state sensing unit 140 outputs the sensed state of the system environment to the setting control unit 160. In particular, the state sensing unit 140 is characterized in that temperature of the image formation apparatus is detected as a system environment. As described above, since each of the ring oscillators 100 is sensitive to the noise, its oscillation frequency may vary according to temperature change at the time of design. Therefore, by detecting the temperature, the state sensing unit 140 allows the setting control unit 160 to detect the temperature change.

Consequently, in response to the result detected by the state sensing unit 140, the setting control unit 160 selects and sets a ring oscillator corresponding to change of the loopspeed detected by the loopspeed detection unit 120. When the result detected by the state sensing unit 140 is input, the setting control unit 160 requests the loopspeed of the previously-set ring oscillator from the loopspeed detection unit 120. The setting control unit 160 then detects the ring oscillator corresponding to the change of the loopspeed transmitted from the loopspeed detection unit 120 and outputs to the plurality of ring oscillators 100 the setting signal to set the detected ring oscillator.

Figure 2:
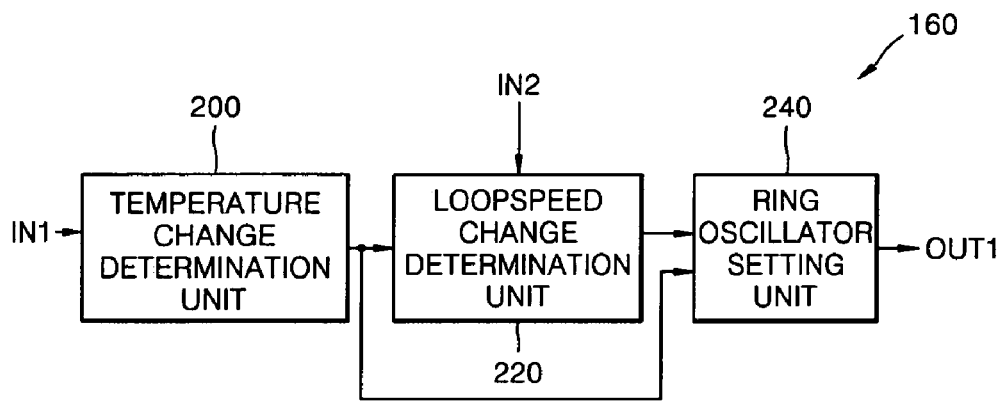
FIG. 2 is a block diagram for explaining a setting control unit shown in FIG. 1.

FIG. 2 is a block diagram for explaining the setting control unit 160 shown in FIG. 1. The setting control unit 160 includes a temperature change determination unit 200, a loopspeed change determination unit 220, and a ring oscillator setting unit 240.

The temperature change determination unit 200 determines whether or not the temperature of the image formation apparatus detected by the state sensing unit 140 exceeds the previously set temperature by a predetermined temperature change amount or more. When the temperature of the image formation apparatus detected is input through an input terminal IN1, the temperature change determination unit 200 determines whether or not the input temperature of the image formation apparatus exceeds the predetermined temperature at the time the ring oscillator was previously set. Then, a determination is output to the loopspeed change determination unit 220 and the ring oscillator setting unit 240.

In response to the determination of the temperature change determination unit 200, the loopspeed change determination unit 220 determines whether or not the actual loopspeed of the previously-set ring oscillator exceeds an ideal loopspeed of the previously-set ring oscillator by a predetermined change amount or more. When the determination that temperature of the image formation apparatus exceeds the temperature at the time the ring oscillator was previously set is received from the temperature change determination unit 200, the loopspeed change determination unit 220 determines whether or not an actual loopspeed input through an input terminal IN2 exceeds an ideal loopspeed of the previously-set ring oscillator by a predetermined loopspeed change such as 20% of ideal loopspeed of the previously-set ring oscillator. In turn, the loopspeed change determination unit 220 outputs the determination to the ring oscillator setting unit 240. For this reason, the loopspeed change determination unit 220 stores ideal loopspeed information on each of the ring oscillators 100.

In response to the determination of the loopspeed change determination unit 220, the ring oscillator setting unit 240 selects and sets a ring oscillator having a larger loopspeed than that of the previously-set ring oscillator when temperature increases by the predetermined temperature change amount or more above the previously set temperature. Alternatively, the ring oscillator setting unit 240 selects and sets a ring oscillator having a smaller loopspeed than that of the previously-set ring oscillator when temperature decreases by the predetermined temperature change amount or more below the previously set temperature. When the determination that the actual loopspeed of the previously-set ring oscillator exceeds the ideal loopspeed is received from the loopspeed change determination unit 220, the ring oscillator setting unit 240 detects a ring oscillator having a larger loopspeed than that of the previously-set ring oscillator. This is done according to the determination from the temperature change determination that the temperature increases by the predetermined temperature change amount or more above the previously set temperature. The determination is outputted to the plurality of ring oscillators 100 through an output terminal OUT1 as a setting signal.

Alternatively, when the determination that the actual loopspeed of the previously-set ring oscillator exceeds the ideal loopspeed is received from the loopspeed change determination unit 220, the ring oscillator setting unit 240 detects a ring oscillator having a smaller loopspeed than that of the previously-set ring oscillator. This is done according to the determination from the temperature change determination unit 200 that the temperature decreases by the predetermined temperature change amount or more below the previously set temperature. The determination is outputted to the plurality of ring oscillators 100 through the output terminal OUT1 as a setting signal.

In general, when temperature of the image formation apparatus increases, the loopspeed of the ring oscillator is gradually reduced. Therefore, a ring oscillator having a faster loopspeed is detected and set among the plurality of ring oscillators 100 to compensate for the reduced loopspeed caused by increased temperature. In addition, when the temperature of the image formation apparatus decreases, clock generation or frequency modulation by a ring oscillator smaller than before is required. Therefore, a ring oscillator requiring a small loopspeed is detected and set according to decreased temperature.

Further, the ring oscillator setting unit 240 is characterized in that the temperature of the image formation apparatus detected by the state sensing unit is set to another previously set temperature at the time of setting the ring oscillator. The newly set temperature becomes a criterion for temperature change over the previously set temperature.

The plurality of ring oscillators 100 reset the previously-set ring oscillator to the new ring oscillator according to the setting signal.

Video clock generation or frequency modulation is preferably performed at the oscillation frequency generated by the ring oscillator set by the ring oscillator setting unit 240. In other words, a laser printer modulator (not shown) modulates frequency by using the oscillation frequency generated by the ring oscillator set by the ring oscillator setting unit 240. In addition, a clock generator (not shown) generates the video clocks by using the oscillation frequency generated by the ring oscillator set by the ring oscillator setting unit 240. Therefore, although system environment such as temperature is changed, degradation of the image quality can be prevented.

Now, a ring oscillator setting method depending on environmental change of an image formation apparatus in accordance with an embodiment of the present invention will be described with reference to the attached drawings.

FIG. 3 is a flow chart for explaining a ring oscillator setting method depending on environmental change of an image formation apparatus.

First, a state of system environment of the image formation apparatus is detected (operation S300). As described above, each of the ring oscillators 100 is sensitive to noise so that its oscillation frequency may vary depending on temperature change at the time of design. Therefore, each of the ring oscillators 100 is characterized in that temperature of the image formation apparatus is detected as a system environment.

After operation S300, a loopspeed representing the number of pulses generated at the oscillation frequency by the previously-set ring oscillator for a predetermined unit time is detected (operation S302). Among the plurality of ring oscillators 100, the loopspeed of the oscillation frequency generated by the previously-set ring oscillator is detected.

After the operation S302, a ring oscillator corresponding to change of the detected loopspeed is detected and set among the plurality of ring oscillators 100. Each ring oscillator generates a different oscillation frequency (operation S304).

FIG. 4 is a flow chart for explaining operation S304 shown in FIG. 3 in accordance with an embodiment of the present invention.

First, it is determined whether or not the temperature of the image formation apparatus exceeds a previously set temperature by a predetermined temperature change amount or more (operation S400). In other words, it is determined whether or not the input temperature of the image formation apparatus exceeds the temperature at the time the ring oscillator was set by the predetermined temperature change amount or more such as 10 degrees.

If the temperature of the image formation apparatus does not exceed the previously set temperature by the predetermined temperature change amount or more, the process returns to operation S400, and repeats the operation described above.

Otherwise, if the temperature of the image formation apparatus exceeds the previously set temperature, it is determined whether or not an actual loopspeed exceeds an ideal loopspeed (operation S402). In other words, it is determined whether or not the actual loopspeed of the previously-set ring oscillator of the above-mentioned loopspeed detection unit 120 exceeds the ideal loopspeed of the previously-set ring oscillator by the predetermined loopspeed change amount or more, such as 20% of ideal loopspeed of the previously-set ring oscillator.

If the actual loopspeed detected of the previously-set ring oscillator does not exceed the ideal loopspeed of the previously-set ring oscillator by the previously set loopspeed change amount or more, the process returns to operation S400 and repeats the above-mentioned operations.

Otherwise, if the actual detected loopspeed of the previously-set ring oscillator exceeds the ideal loopspeed of the previously-set ring oscillator by the previously set loopspeed change amount or more, a ring oscillator having a larger loopspeed than that of the previously-set ring oscillator is detected and set when the temperature increases by the predetermined temperature change or more above the previously set temperature. Thus, a ring oscillator having a smaller loopspeed than that of the previously-set ring oscillator is detected and set when the temperature decreases by the predetermined temperature change amount or more below the previously set temperature (operation S404).

In other words, depending on the determination from the temperature change determination unit 200 that the temperature increases by the predetermined temperature change amount or more above the previously set temperature, a ring oscillator having a larger loopspeed than that of the previously-set ring oscillator is detected and set. Otherwise, depending on the determination from the temperature change determination unit 200 that the temperature decreases, a ring oscillator having a smaller loopspeed than that of the previously-set ring oscillator is detected and set.

According to the ring oscillator setting apparatus and method depending on environmental change as described herein above, even when external environmental factors such as temperature and voltage of the image formation apparatus change, a ring oscillator having an optimal loopspeed to generate a video clock can be set. Hence, it is possible to minimize degradation of image quality caused by environmental changes.

While the invention has been shown and described with reference to certain embodiments thereof, it will be understood by those skilled in the art that various changes in form and details may be made therein without departing from the spirit and scope of the invention as defined by the appended claims.

What is claimed is:

1. A ring oscillator setting apparatus depending on environmental changes of an image formation apparatus comprising:
   a plurality of ring oscillators to generate different oscillation frequencies;
   a loopspeed detection unit to detect a loopspeed representing the number of pulses generated at the oscillation frequency by one of the ring oscillators selected from the plurality of ring oscillators for a predetermined unit time;
   a state sensing unit to sense a state of system environment of the image formation apparatus; and
   a setting control unit to select and set at least one of the ring based on a change of the loopspeed detected from the loopspeed detection unit among the plurality of ring oscillators in response to the detected state of the state sensing unit.

2. The ring oscillator setting apparatus according to claim 1, wherein the state sensing unit detects temperature of the image formation apparatus as a system environment.

3. The ring oscillator setting apparatus according to claim 2, wherein the setting control unit comprises:
   a temperature change determination unit to determine whether or not the temperature of the image formation apparatus detected by the state sensing unit exceeds a previously set temperature by a predetermined temperature change amount or more;
   a loopspeed change determination unit to determine whether or not an actual loopspeed of a previously-set ring oscillator detected by the loopspeed detection unit exceeds an ideal loopspeed of the previous set ring oscillator by a predetermined loopspeed change amount or more in response to the determination of the temperature change determination unit; and
   a ring oscillator setting unit to detect the at least one of the ring oscillators selected in response to the determination of the loopspeed change determination unit,
   wherein, when the temperature increases by the predetermined temperature change amount or more above the previously set temperature, the at least one of the ring oscillators selected having a larger loopspeed than that of the previously-set ring oscillator is detected, and
   wherein, when the temperature decreases by the predetermined temperature change amount or more below the previously set temperature, the at least one of the ring oscillators selected having a smaller loopspeed than that of the previously-set ring oscillator is detected.

4. The ring oscillator setting apparatus according to claim 3, wherein the ring oscillator setting unit sets temperature of the image formation apparatus detected by the state sensing unit as another previously set value, at the time of setting the at least one of the selected ring oscillators.

5. The ring oscillator setting apparatus according to claim 3,
   wherein the ring oscillator setting apparatus depending on environmental changes of the image formation apparatus uses the oscillation frequency to generate or modulate a video clock, and
   wherein the at least one of the ring oscillators selected to be set by the ring oscillator setting unit generates the oscillation frequency.

6. A ring oscillator setting method depending on environmental changes, the method comprising:
   (a) detecting a state of system environment of an image formation apparatus;
   (b) detecting a loopspeed representing the number of pulses generated at an oscillation frequency by a previously-set ring oscillator for a predetermined unit time; and
   (c) selecting and setting a ring oscillator corresponding to changes of the detected loopspeed among a plurality of ring oscillators each generating a different oscillation frequency.

7. The ring oscillator setting method according to claim 6, wherein, in operation (a), temperature of the image formation apparatus is detected as a system environment.

8. The ring oscillator setting method according to claim 6, wherein operation (c) comprises:
   (c1) determining whether or not the temperature of the image formation apparatus exceeds previously set temperature by a predetermined temperature change amount or more;
   (c2) when the temperature exceeds the previously set temperature by the predetermined temperature change amount or more, determining whether or not an actual loopspeed detected of a previously-set ring oscillator exceeds an ideal loopspeed of the previously-set ring oscillator by a predetermined loopspeed change amount or more; and
   (c3) when the actual loopspeed detected exceeds the ideal loop value by the predetermined loopspeed change amount or more, detecting a ring oscillator and setting the detected ring oscillator,
   wherein, when the temperature increases by the predetermined temperature change amount or more above the previously set temperature, the ring oscillator having a larger loopspeed than that of the previously-set ring oscillator is detected, and
   wherein, when the temperature decreases by the predetermined temperature change amount or more below the previously set temperature, the ring oscillator having a smaller loopspeed than that of the previously-set ring oscillator is detected.

9. The ring oscillator setting method according to claim 8, wherein, in operation (c3), the detected temperature of the image formation apparatus sets another previously set temperature at the time of setting the ring oscillator.

10. The ring oscillator setting method according to claim 8, wherein the oscillation frequency generated by the set ring oscillator is used to generate or modulate a video clock.

* * * * *